March 1, 1960 E. W. VAN WINKLE 2,927,164
INTERSTAGE COUPLING CIRCUIT FOR A DIRECT CURRENT AMPLIFIER
Filed March 8, 1954
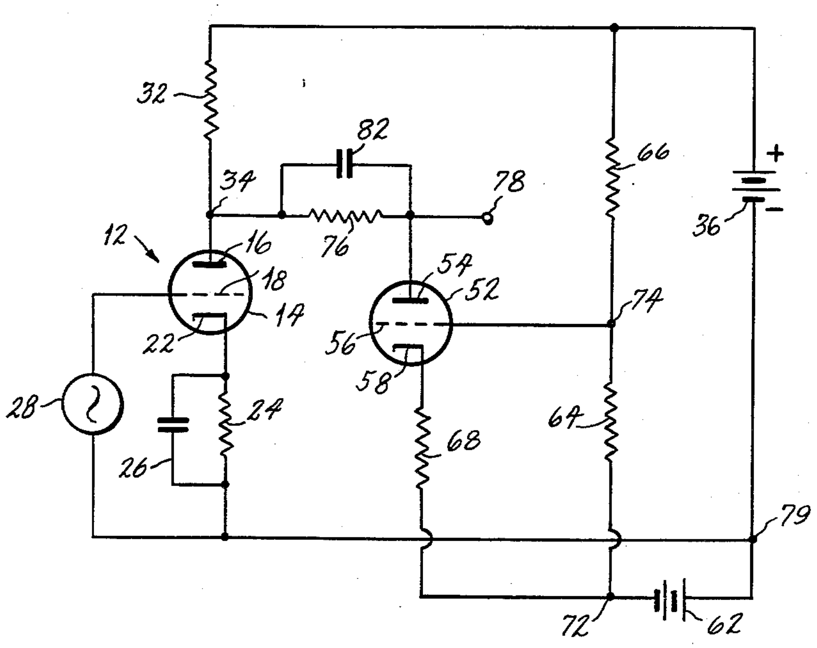
INVENTOR.
EDGAR W. VANWINKLE
BY George Sipkin
Lee J. Huntzberger
ATTORNEYS

United States Patent Office 2,927,164

Patented Mar. 1, 1960

2,927,164

INTERSTAGE COUPLING CIRCUIT FOR A DIRECT CURRENT AMPLIFIER

Edgar W. Van Winkle, Rutherford, N.J., assignor to the United States of America as represented by the Secretary of the Navy Application March 8, 1954, Serial No. 414,911

1 Claim. (Cl. 330—144)

This invention relates to a voltage divider and more particularly to a voltage divider for separating out a constant voltage component from a voltage which is the sum of the constant voltage component and a fluctuating or alternating voltage component.

Where the input signal voltage to an amplifier is of a very low frequency it may be necessary to couple directly the output of the amplifier to the load. If under these conditions a capacitor were used to couple the output of an amplifier to the load, the reactance of the coupling capacitor would be so high as to present substantially an open circuit to the amplified signal output of the amplifier. Hence it is sometimes necessary to couple directly the output of an amplifier to a load. This expedient is usually undesirable and particularly so where the load is the signal grid of a following stage. Obviously an expedient which involves raising the bias of the signal grid of the next stage to a level such as that of a plate supply of the previous stage is not a solution to the problem.

This problem is encountered particularly in facsimile systems where the frequency of the signal extends from somewhere within the audio range down to zero frequency or D.C. For proper operation, it is necessary to amplify the entire frequency range of the signal. The main difficulty is in amplifying the low frequency portions of the signal.

This invention marks a departure from the prior art in that it provides auxiliary circuit means for use with an amplifier to permit coupling of low frequency output of the amplifier to the load while at the same time reducing substantially to zero the constant voltage component of the amplifier output.

An object of this invention is to modify a voltage consisting of a constant direct current voltage component plus a signal component by changing or eliminating the constant direct current voltage component without significantly changing the signal component.

A further object is to provide an interstage coupling circuit for a direct coupled amplifier which substantially reduces the coupled direct voltage level without significantly reducing the signal.

Other objects and many of the attendant advantages of this invention will be readily appreciated as the same becomes better understood by reference to the following detailed description when considered in connection with the accompanying drawings wherein:

The single figure is a schematic diagram of an embodiment of this invention.

In the drawing there is shown a conventional triode amplifier 12 provided with an auxiliary circuit means, hereinafter described, for extending its effectiveness. Triode amplifier 12 includes an evacuated triode 14. Triode 14 has a plate 16, a grid 18 and a cathode 22. A cathode resistor 24 shunted by a cathode bypass capacitor 26 provides for self-biasing of the triode. A signal source, symbolically shown at 28, is connected between the grid 18 and the remote end of cathode resistor 24. A plate load resistor 32, connected in series with the plate 16 provides a terminal 34 at the plate end thereof to permit connection to a load circuit. A plate supply for the triode amplifier 12 is provided by the battery 36 connected in series between the plate load resistor 32 and the cathode resistor 24. Up to this point the description covers a conventional triode amplifier in general use in electronic circuits. However, it is to be noted that no conventional coupling means such as a capacitor or a transformer is shown for coupling the amplified signal to the load.

Generally, a capacitor or a transformer may be used to couple the amplified signal from any particular stage to the next stage or to a load. These intermediate coupling elements are used to transfer only the amplified signal and to block constant voltage components such as the plate voltage supply. Where the coupling elements are designed for operating over a considerable range of frequency, attenuation of the very low frequencies may be so marked as to represent substantially an open circuit to the low frequencies. Therefore, it is necessary to provide means, other than a coupling element such as a capacitor or transformer, for coupling the amplified signal into a load such as the grid of a following stage. The voltage divider described immediately below performs this function.

The voltage divider includes a triode 52 having a plate 54, a grid 56, and a cathode 58. The plate supply for the triode 52 includes the battery 36 plus a second battery 62 connected in additive series. The serially connected batteries 36 and 62 are bridged by a pair of resistors 64 and 66. The pair of resistors constitute a voltage divider but not to be confused with that described in the opening statement, the latter including triode 52. A cathode resistor 68 is connected at one end to the cathode 58 of the triode 52 and at its opposite end is connected to the negative terminal 72 of the battery 62. The triode 52 is biased by the combined effectiveness of the IR drop in cathode resistor 68 and the relative sizes of resistor 64 and resistor 66. A resistor 76 is connected to the output terminal 34 at one of its ends and at its other end is connected to the plate 54 of triode 52. The junction 78 between the resistor 76 and the triode 52 provides one output terminal 78; the other output terminal is at 79. The resistor 76 is bridged by a capacitor 82 to minimize high frequency attenuation.

The battery 62 and the grid bias on triode 52 are such that the triode 52 conducts continuously whereby current flows through the resistor 76. The circuit parameters can be readily designed so that the voltage drop across resistors 32 and 76 in the absence of a signal is equal to the voltage at the terminals of battery 36, there is no constant voltage component at the output terminal 78. In order for the resistor 76 to have a resistance of sufficient magnitude to cause a voltage drop substantially equal to the voltage provided by the battery 36, and at a current level which does not lower the voltage at the plate 16 of the triode 14 below a desirable operating minimum the resistor 76 may be considerably larger than the plate load resistor 32. It is possible to obtain a voltage drop across the resistor 76 substantially equal to that provided by the battery 36 because of the additional battery 62 connected in series with the battery 36, both of which provide the necessary voltage for feeding the necessary current through the resistor 76. Therefore, with the combination of elements described, the constant voltage component can be reduced or even eliminated from the output voltage derived at terminal 34 of the triode amplifier 12. However, the amplified signal at the terminal 34 of the triode amplifier 12 is made available at the terminal 78 for coupling into a following stage with substantially no attenuation.

The equivalent plate resistance of triode 52 to any signal from triode amplifier is equal to $r_p+(u+1)R_K$ where $r_p$ is the plate resistance, $u$ is the gain and $R_K$ is the cathode resistance. This information may be found in "Vacuum Tube Amplifiers," vol. 18 of the M.I.T. Radiation Laboratory Series published by McGraw-Hill, page 427, beginning ten lines from the bottom; the reference states that when a triode has resistors in series with its cathode or plate or both, the triode with its resistors may be considered equivalent to a simple triode having the same $u$ but having a plate resistance equal to $R_p+r_p+(u+1)R_K$. $R_p$ in Fig. 1 is resistor 76 whereby the equivalent circuit resistance of triode 52 and resistor 68 is $r_p+(u+1)R_K$. In practice one may attain an impedance of several megohms between the plate 54 and the remote terminal of the cathode resistor 68 and which is 20 or more times the resistance of resistor 76. For example, a 6SL7 tube with $r_p$=44,000 ohms, and $u$=70 may be used, with $R_K$ equal to 200,000 ohms and $R_p$ equal to 1 megohm. Accordingly, the alternating or varying voltage at terminal 78 may be as high as 96 percent of the voltage at terminal 34. Therefore it is possible to couple the amplified signal available at terminal 34 to the load without any accompanying constant voltage component of the plate supply. The capacitor 82 is provided because the tube 52 has certain shunt capacities to ground which effect its high frequency response. The capacitor 82 is connected across the resistor 76 to improve the high frequency response. At high frequency the varying voltage is bypassed through the capacitor 82 which presents a substantially lower impedance than the resistor 76.

Obviously many modifications and variations of the present invention are possible in the light of the above teachings. It is therefore to be understood that within the scope of the appended claim the invention may be practiced otherwise than as specifically described.

I claim:

An improved direct coupled amplifier comprising an amplifier stage including a signal amplifying tube, a first plate load resistor and a plate supply source; a second amplifying tube, a cathode resistor therefor and a second plate load resistor connected between the plates of both said tubes; the connection between said second plate load resistor and the plate of said second tube providing an output terminal relative to the negative end of said plate supply source; a supplemental plate supply source connected in additive series with the negative end of said first-mentioned plate supply source and to said cathode resistor whereby both said plate supply sources, said cathode resistor, said second amplifying tube and both said plate load resistors in series and form a closed loop; means biasing said second amplifying tube and directly responsive to change in the voltage across said series-connected plate supply sources, whereby substantially constant current flows through said second tube, the gain and plate resistance of said second tube, and cathode resistor, and the bias for said second tube, and said second plate supply source being such that the current flow through said second plate load resistor is substantially equal to the voltage of the plate of said signal tube relative to the negative end of said first plate supply source less any signal voltage at the plate of said signal tube, the gain and plate resistance of said second tube and said cathode resistor being such that the impedance of said second tube and cathode resistor relative to said second plate load resistor causes over ninety percent of the signal at the plate of said first tube to appear at said output terminal, said second plate load resistor being sufficiently larger than said first plate load resistor so that current flow through said second tube does not materially reduce the plate voltage of said first tube, said bias means responding to power supply voltage drift to change the current flow through said second tube to minimize change in the voltage level at the output terminal resulting from the drift.

References Cited in the file of this patent

UNITED STATES PATENTS

| | | |
|---|---|---|
| 2,369,138 | Cook | Feb. 13, 1945 |
| 2,513,354 | Parker | July 4, 1950 |
| 2,549,833 | Martinez | Apr. 24, 1951 |
| 2,554,469 | Minzer | May 22, 1951 |
| 2,579,633 | Wadzinski | Dec. 25, 1951 |
| 2,763,733 | Coulter | Sept. 18, 1956 |